United States Patent
Ishikawa et al.

(10) Patent No.: US 10,353,451 B2
(45) Date of Patent: Jul. 16, 2019

(54) SEMICONDUCTOR DEVICE AND SYSTEM

(71) Applicant: Renesas Electronics Corporation, Tokyo (JP)

(72) Inventors: Tatsuya Ishikawa, Tokyo (JP); Yoshiaki Daimon, Tokyo (JP); Norihiko Ishizaki, Tokyo (JP); Yuichi Iwaya, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 108 days.

(21) Appl. No.: 15/234,939

(22) Filed: Aug. 11, 2016

(65) Prior Publication Data

US 2017/0090540 A1 Mar. 30, 2017

(30) Foreign Application Priority Data

Sep. 30, 2015 (JP) .................................. 2015-194139

(51) Int. Cl.
*G06F 1/26* (2006.01)
*H03K 21/38* (2006.01)
(52) U.S. Cl.
CPC ............. *G06F 1/266* (2013.01); *H03K 21/38* (2013.01)
(58) Field of Classification Search
CPC ...................................................... G06F 1/266
See application file for complete search history.

(56) References Cited

U.S. PATENT DOCUMENTS

| | | | | |
|---|---|---|---|---|
| 5,144,310 | A * | 9/1992 | Sato | ........................ H03M 1/46 341/158 |
| 8,284,619 | B2 | 10/2012 | Nakakubo | |
| 9,310,866 | B2 | 4/2016 | Koyama et al. | |
| 9,906,215 | B2 | 2/2018 | Sonhehara et al. | |
| 2005/0198547 | A1* | 9/2005 | Morse | ....................... G06F 1/26 713/330 |
| 2008/0140565 | A1* | 6/2008 | DeBenedetti | .......... G06Q 20/10 705/39 |
| 2008/0298385 | A1 | 12/2008 | Ng et al. | |

FOREIGN PATENT DOCUMENTS

| | | |
|---|---|---|
| JP | H09-44277 A | 2/1997 |
| JP | 2001-244813 A | 9/2001 |
| JP | 2005-147934 A | 6/2005 |
| JP | 2008-305499 A | 12/2008 |
| JP | 2014-039240 A | 2/2014 |
| JP | WO2015/118768 A1 | 8/2015 |

OTHER PUBLICATIONS

Japanese Office Action dated Feb. 19, 2019, in Japanese Patent Application No. 2015-194139 with an English translation.

* cited by examiner

*Primary Examiner* — Kim Huynh
*Assistant Examiner* — Eric Chang
(74) *Attorney, Agent, or Firm* — McGinn IP Law Group, PLLC

(57) ABSTRACT

In a system using a device not adapted to a single wire bus, a semiconductor device includes an external terminal to be coupled to a power source terminal of an external device, a port that supplies a power source voltage for the external device to the external terminal, a power manager that controls an output of the port, and a CPU that controls an operation of the power manager.

16 Claims, 16 Drawing Sheets

FIG. 8

| Input B | Input A | |
|---|---|---|
| | 0 | 1 |
| 0 | Normal High | Low |
| 1 | Weak High | Weak High |

FIG. 9

| Output Setting | Normal High | Weak High |
|---|---|---|
| Normal | Read "1" | Read "1" |
| Disconnection | Read "1" | Read "1" |
| Ground Fault | Read "0" | Read "0" |

FIG. 11

| Input B | Input A = 0 | | Input A = 1 |
| --- | --- | --- | --- |
| | Input C = 0 | Input C = 1 | Input C = don't care |
| 0 | Normal High Driving Capability = Normal | Normal High Driving Capability = Strong | Low |
| 1 | Weak High | | |

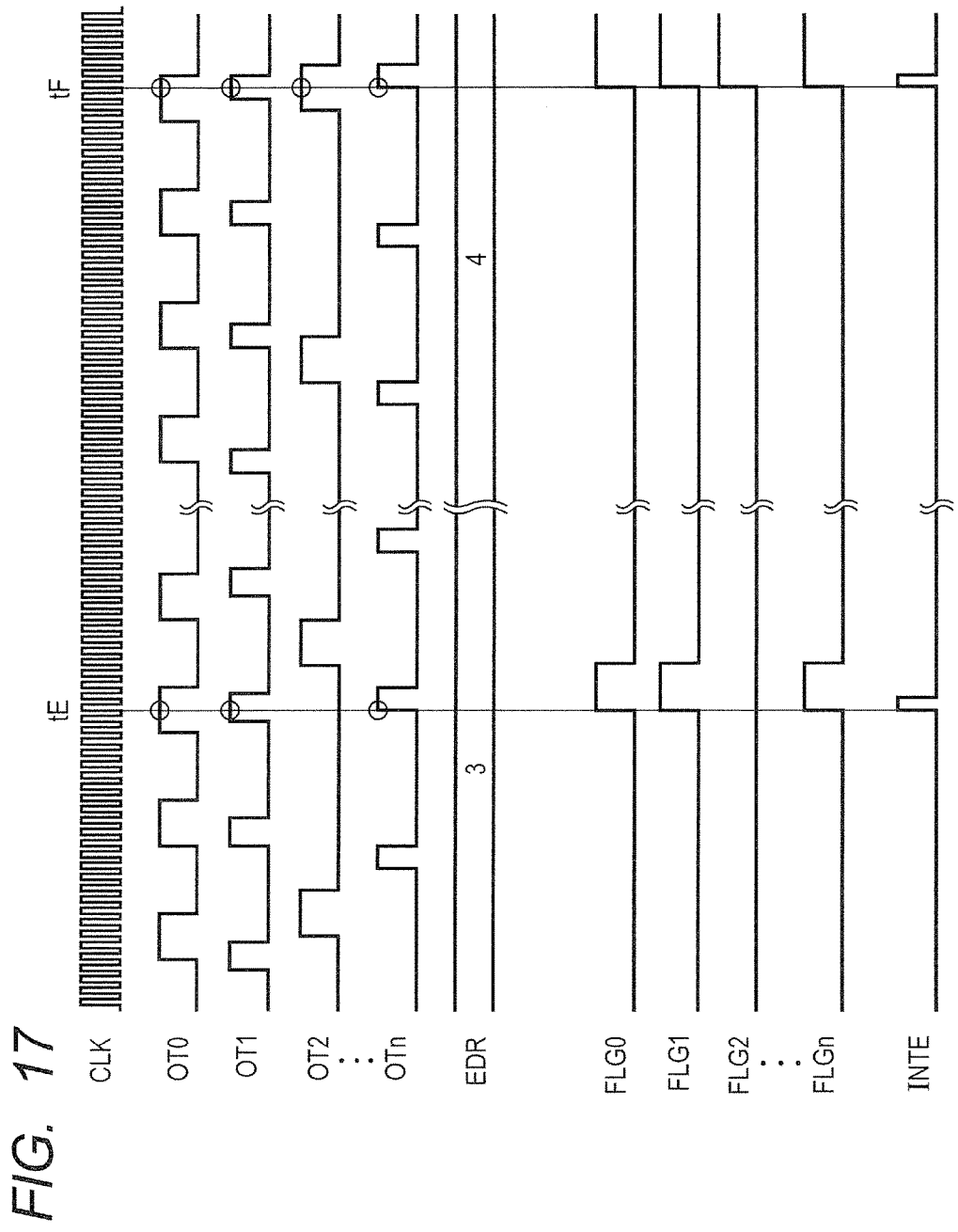

SEMICONDUCTOR DEVICE AND SYSTEM

CROSS-REFERENCE TO RELATED APPLICATIONS

The disclosure of Japanese Patent Application No. 2015-194139 filed on Sep. 30, 2015 including the specification, drawings and abstract is incorporated herein by reference in its entirety.

BACKGROUND

The disclosure relates to a semiconductor device, and can be applied to, for example, a microcontroller that supplies a power source to an external sensor.

In order to improve complexity of an in-vehicle system, a single wire bus has been proposed. A power source is supplied to a device using a signal line in the single wire bus, and thus a power source circuit for the device is not needed. The device adapted to the single wire bus uses the power source for the device in such a manner that a capacitor is coupled to the signal line through a diode and the voltage of the signal line is charged to the capacitor (for example, US Patent Application Publication No. 2008/0298385).

SUMMARY

In the in-vehicle system adopting the single wire bus, for example, it is necessary to adapt to the single wire bus on the device side such as a sensor. However, all devices cannot adapt to the single wire bus. In a system using a device not adapted to the single wire bus, a circuit such as a power source circuit for the device is needed.

The other objects and novel features will become apparent from the description of the specification and the accompanying drawings.

The following is a representative summary of the disclosure.

Namely, a semiconductor device includes a port that is coupled to a power source of an external device such as a sensor to directly supply electric power.

According to the semiconductor device, a circuit such as a power source circuit for a device is not needed.

BRIEF DESCRIPTION OF THE DRAWINGS

FIG. 8 is a truth table of an output buffer of FIG. 6;

FIG. 9 is a table for explaining failure detection by the port of FIG. 6;

FIG. 11 is a truth table of an output buffer of FIG. 10;

FIG. 17 is a timing chart for explaining an error detection function of the power manager of FIG. 12.

DETAILED DESCRIPTION

Hereinafter, an embodiment, an example, and a modified example will be described using the drawings. It should be noted that the same signs are given to the same constitutional elements in the following description, and repeated explanations will be omitted in some cases.

In order to further improve fuel efficiency, to respond to stricter emission control in each country, to improve safety functions such as an antilock brake system (abbreviated as ABS), an air-bag, and a collision damage reducing brake, and to improve in-vehicle comfort, the number of electronic control units (abbreviated as ECUs) to be mounted in recent automobiles has been increased, and power consumption by the ECUs tends to be increased. On the other hand, drastic improvement in the battery performance of automobiles cannot be expected, and it has been difficult to follow an increase in the number of ECUs. Thus, it has been necessary to reduce the current consumption of each ECU.

As a method of reducing the current consumption of each ECU, it is conceivable to adopt a microcontroller and a sensor that are small in power consumption. However, there are limitations to reduction in power consumption using a device alone such as the microcontroller and the sensor. In order to further reduce the power consumption, the electric source is not supplied to a device such as a sensor that need not be constantly operated at non-operating timing. Accordingly, it can be expected to reduce the total power consumption of the ECU system. However, in order to control the timing of supplying the power source, it is necessary to prepare a dedicated sequencer to control the power source, and a circuit that can turn on or off the supply of the power source to the sensor and the like from the sequencer is needed. Thus, it is disadvantageous in terms of cost.

Embodiment

Figure 1:
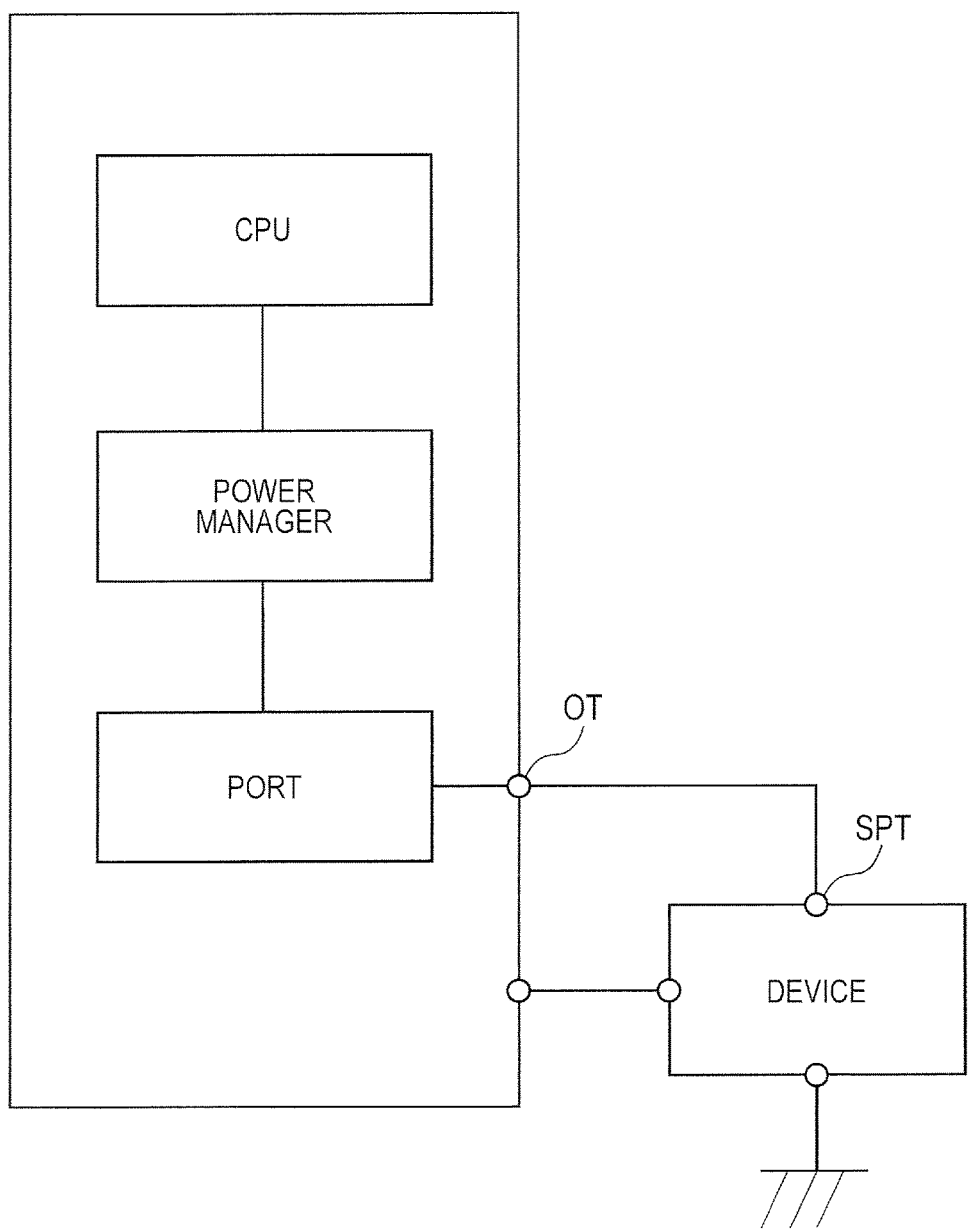
FIG. 1 is a block diagram for explaining a semiconductor device according to an embodiment.

FIG. 1 is a block diagram for explaining a semiconductor device according to an embodiment.

The semiconductor device according to the embodiment includes an external terminal (OT) to be coupled to a power source terminal (SPT) of a device (DEVICE) such as a sensor, a port (PORT) that supplies a power source voltage of the device (DEVICE) to the external terminal (OT), a power manager (POWER MANEGER) that controls an output of the port (PORT), and a central processing unit (CPU) that controls an operation of the power manager (POWER MANEGER). The power consumption can be reduced by directly feeding power from the port to the device without an increase in the cost of a power source circuit for the device and the power manager.

As an example of the embodiment, an ECU system including an ECU having a microcontroller and a sensor will be described, but the example is not limited to this.

Example

Figure 2:
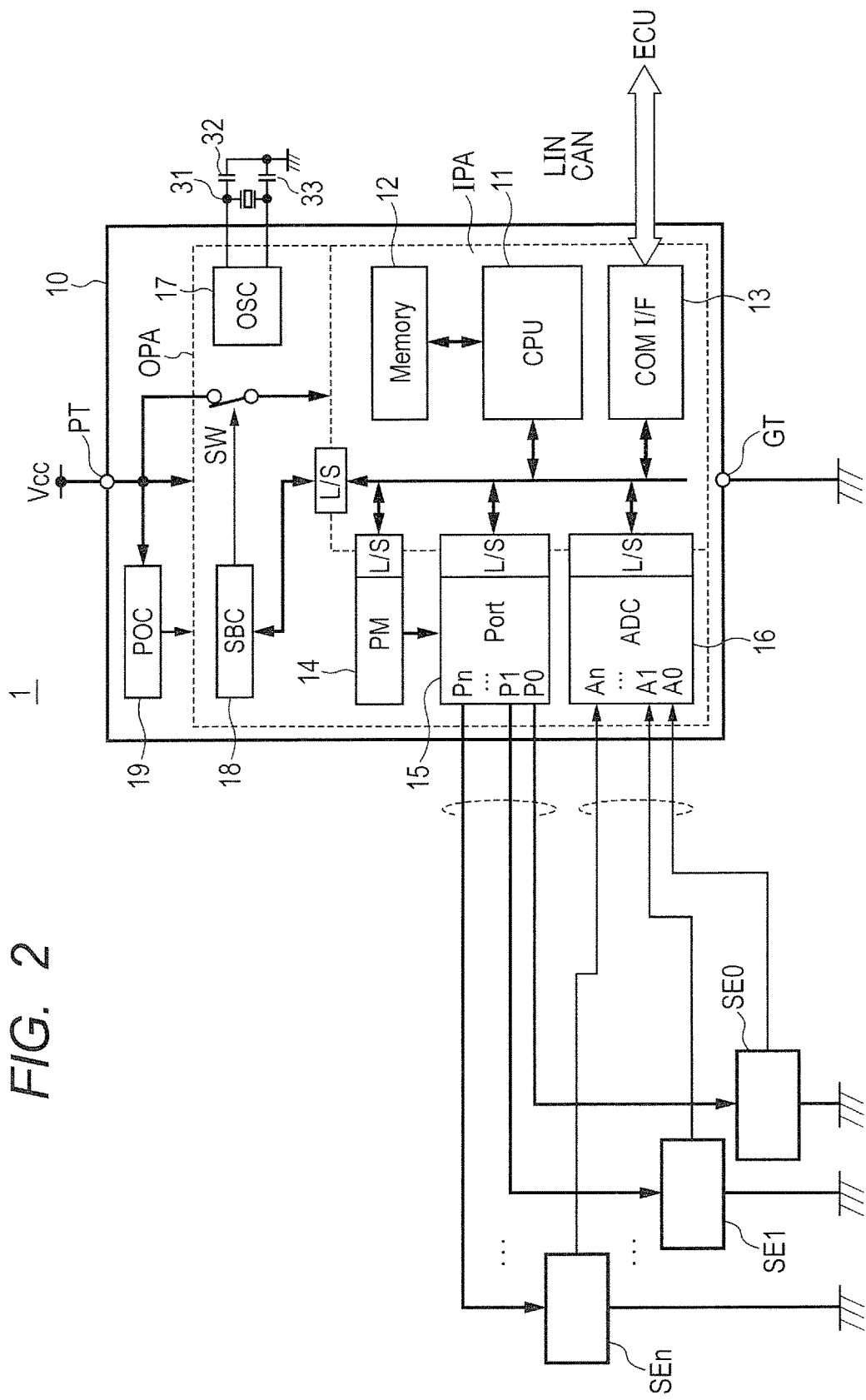
FIG. 2 is a block diagram for showing a configuration of an ECU system according to an example.
Figure 3:
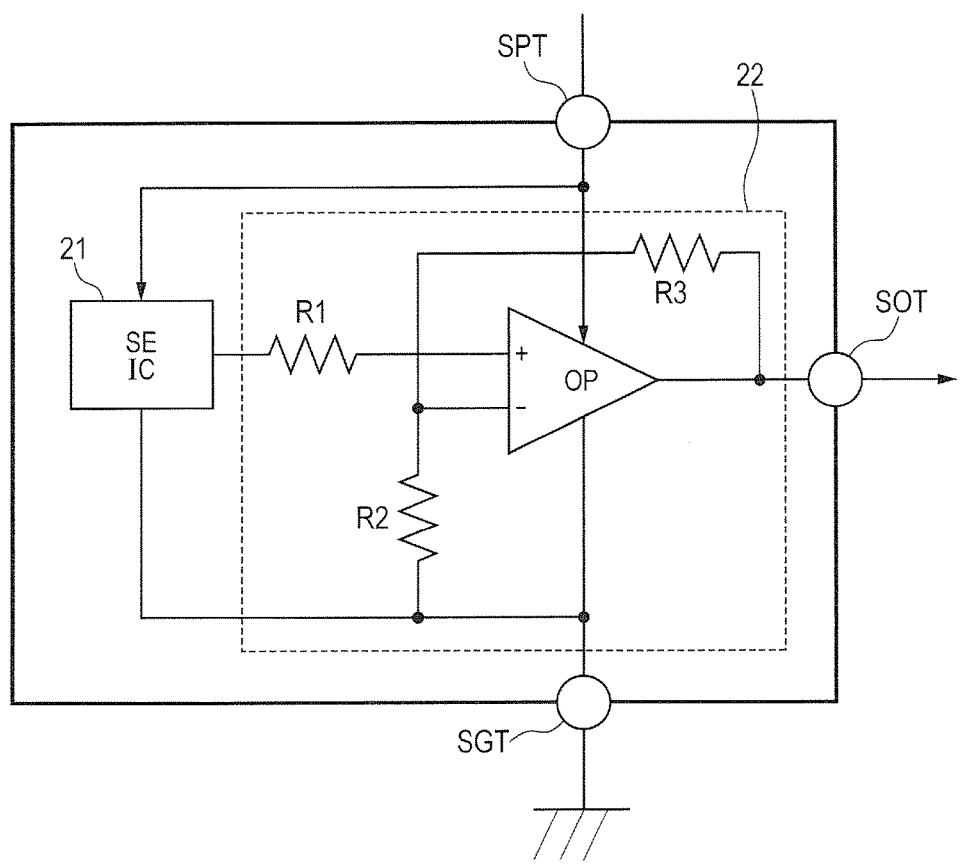
FIG. 3 is a block diagram for showing a configuration of a sensor of FIG. 2.

FIG. 2 is a block diagram for showing a configuration of the ECU system according to the example. FIG. 3 is a block diagram for showing a configuration of the sensor of FIG. 2.

An ECU system 1 includes a microcontroller 10 that is a semiconductor device, sensors SE0 to SEn that are external devices, an oscillator 31, capacitors 32 and 33, and a power source circuit (not shown). The power source circuit supplies a power source voltage (Vcc) to the microcontroller 10.

The microcontroller 10 includes, on a semiconductor substrate, a central processing unit (CPU) 11, a memory (Memory) 12, a communication interface (COM I/F) 13, a power manager (PM) 14, an input/output port unit (PORT) 15, an A/D conversion circuit (ADC) 16, an oscillation circuit (OSC) 17, a standby control circuit (SBC) 18, a power-on circuit (POC) 19, a power source terminal PT, and a grounding terminal GT. The CPU 11, the memory 12, and the communication interface 13 are included in an internal power source area IPA, and are operated by a voltage lower than that of an external power source input from the power source terminal PT. In addition, the voltage supplied to the internal power source area IPA is stopped in a standby mode. The power manager 14, the input/output port unit 15, the A/D conversion circuit 16, the oscillation circuit 17, and the standby control circuit 18 are included in an external power source area OPA. The external power source is supplied in a standby mode, but the oscillation circuit 17 is stopped. A level shifter (L/S) is arranged between the internal power source area IPA and the external power source area OPA. The circuits of the external power source area OPA are stopped when the system is reset and in a standby mode. The power-on circuit 19 is arranged outside the external power source area OPA.

The CPU 11 controls the ECU system 1 in accordance with a program stored in the memory 12 through the respective units of the microcontroller 10. The memory 12 includes an electrically-rewritable non-volatile memory such as a flash memory that stores a program and data, and a volatile memory such as an SRAM that stores data. The communication interface 13 communicates with other ECUs through an in-vehicle LAN such as LIN or CAN.

The power manager 14 supplies a power source to the sensors SE0 to SEn by controlling the input/output port unit 15. The power manager 14 includes a timer that sets and measures time and a storage unit (RAM/register) that preliminarily stores output data of the input/output port unit 15 used to turn on or off the power source of the sensors SE0 to SEn. The detail of the power manager 14 will be described later.

The input/output port unit 15 includes a plurality of ports P0 to Pn to be coupled to power source terminals of the respective sensors SE0 to SEn. The ports P0 to Pn supplying the power source voltage to the sensors SE0 to SEn supply, at least, two values to the power source terminals of the sensors SE0 to SEn, and turn on or off the sensors SE0 to SEn using the two values. When the ports P0 to Pn output "1" (VOH), the power source is supplied to the sensors SE0 to SEn to be turned on. When the ports P0 to Pn output "0" (VOL), the sensors SE0 to SEn are turned off. It should be noted that it is not necessary to couple the ports P0 to Pn to the sensors SE0 to SEn on a one-to-one basis. On/off signals associated with the respective sensors SE0 to SEn are output from the ports P0 to Pn, the power source voltage is supplied to each of the sensors SE0 to SEn from, at least, one port, and the number of terminals to supply the power source voltage is optimized. Units that change the current driving capability of the terminals may be provided in the ports P0 to Pn supplying the power source voltage to the respective sensors SE0 to SEn. Accordingly, the driving capability can be optimized in accordance with the operation lode of the sensors, and switching noise can be reduced. It should be noted that the input/output port unit 15 is a general-purpose input/output port, and includes a port that is not coupled to the sensor. The detail of the ports P0 to Pn will be described later.

The A/D conversion circuit 16 includes a plurality of input channels A0 to An and input terminals (not shown) coupled thereto. The input terminals are coupled to output terminals SOT of the respective sensors SE0 to SEn. The A/D conversion circuit 16 converts analog signals input from the input channels A0 to An to digital signals.

The oscillation circuit 17 generates a clock signal using the oscillator 31 such as a crystal oscillator and the capacitors 32 and 33, all of which are attached to the outside of the system. The standby control circuit 18 controls the power source supplied to the internal power source area IPA using a power source switch SW. When the supply of the external power source starts, the power-on circuit 19 generates a reset signal, and resets the respective circuits of the microcontroller 10.

Each of the sensors SE0 to SEn includes a sensor IC (SE IC) 21, an amplifier circuit 22, a power source terminal SPT, a sensor output terminal SOT, and a grounding terminal SGT. The amplifier circuit 22 is configured using an operational amplifier OP and resistors R1, R2, and R3. The power source of the sensors SE0 to SEn is supplied from the ports P0 to Pn of the microprocessor 10.

Figure 4:
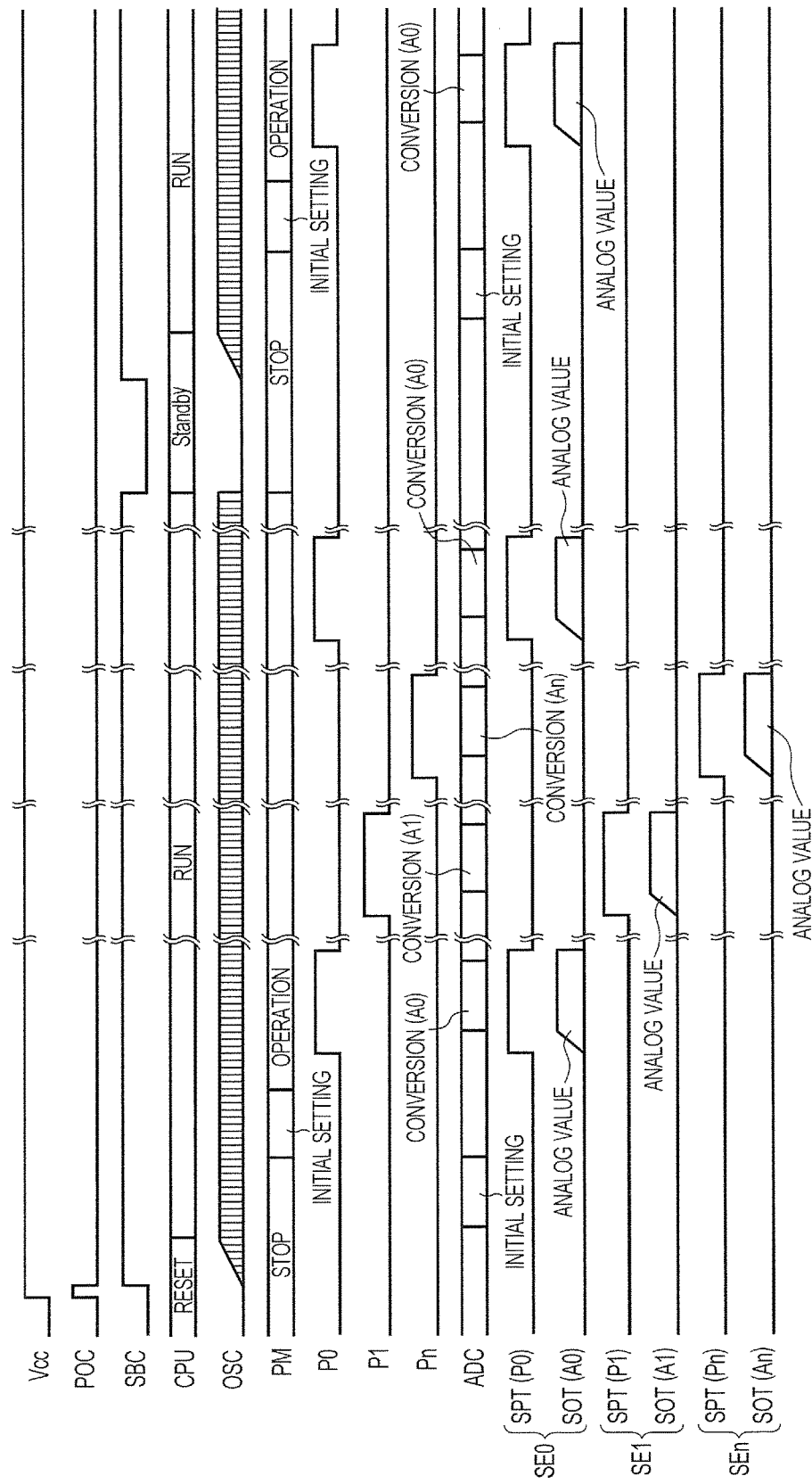
FIG. 4 is an operational timing chart of the ECU system of FIG. 2.

FIG. 4 is an operational timing chart of the ECU system of FIG. 2.

When the supply of the power source voltage (Vcc) starts, the power-on circuit (POC) 19 generates a reset signal to reset the standby control circuit (SBC) 18, and the standby mode is cancelled. In addition, the oscillation circuit (OSC) 17 starts to oscillate. In this case, the CPU 11 is in a reset state. When the reset state (RESET) is cancelled after the oscillation of the oscillation circuit 17 is stabilized, the CPU 11 starts to normally run (RUN). The CPU 11 initially sets the A/D conversion circuit (ADC) 16, and then initially sets the power manager 14.

When the operation of the power manager 14 starts and the port P0 outputs a predetermined period of time "1", the power source is supplied to the power source terminal SPT of the sensor SE0 (SPT(P0)). Then, the sensor SE0 outputs a signal having an analog value from the output terminal SOT to the input channel A0 of the A/D converter 16 (SOT(A0)), and the A/D converter 16 converts the signal into a signal having a digital value (conversion (A0)). Next, when the port P1 outputs a predetermined period of time "1", the power source is supplied to the power source terminal SPT of the sensor SE1 (SPT(P1)). Then, the sensor SE1 outputs a signal having an analog value from the output terminal SOT to the input channel A1 of the A/D converter 16 (SOT(A1)), and the A/D converter 16 converts the signal into a signal having a digital value (conversion (A1)). Next, when the port Pn outputs a predetermined period of time "1", the power source is supplied to the power source terminal SPT of the sensor SEn (SPT(Pn)). Then, the sensor SEn outputs a signal having an analog value from the output terminal SOT to the input channel An of the A/D converter 16 (SOT(An)), and the A/D converter 16 converts into the signal into a signal having a digital value (conversion (An)).

When the microcontroller 10 is put in a standby mode (Standby) by the standby control circuit 18, the CPU 11, the oscillation circuit 17, and the power manager 14 are stopped. When the standby mode of the microcontroller 10 is cancelled by the standby control circuit 18, the microcontroller 10 performs the operation similar to the reset cancellation.

Figure 5:
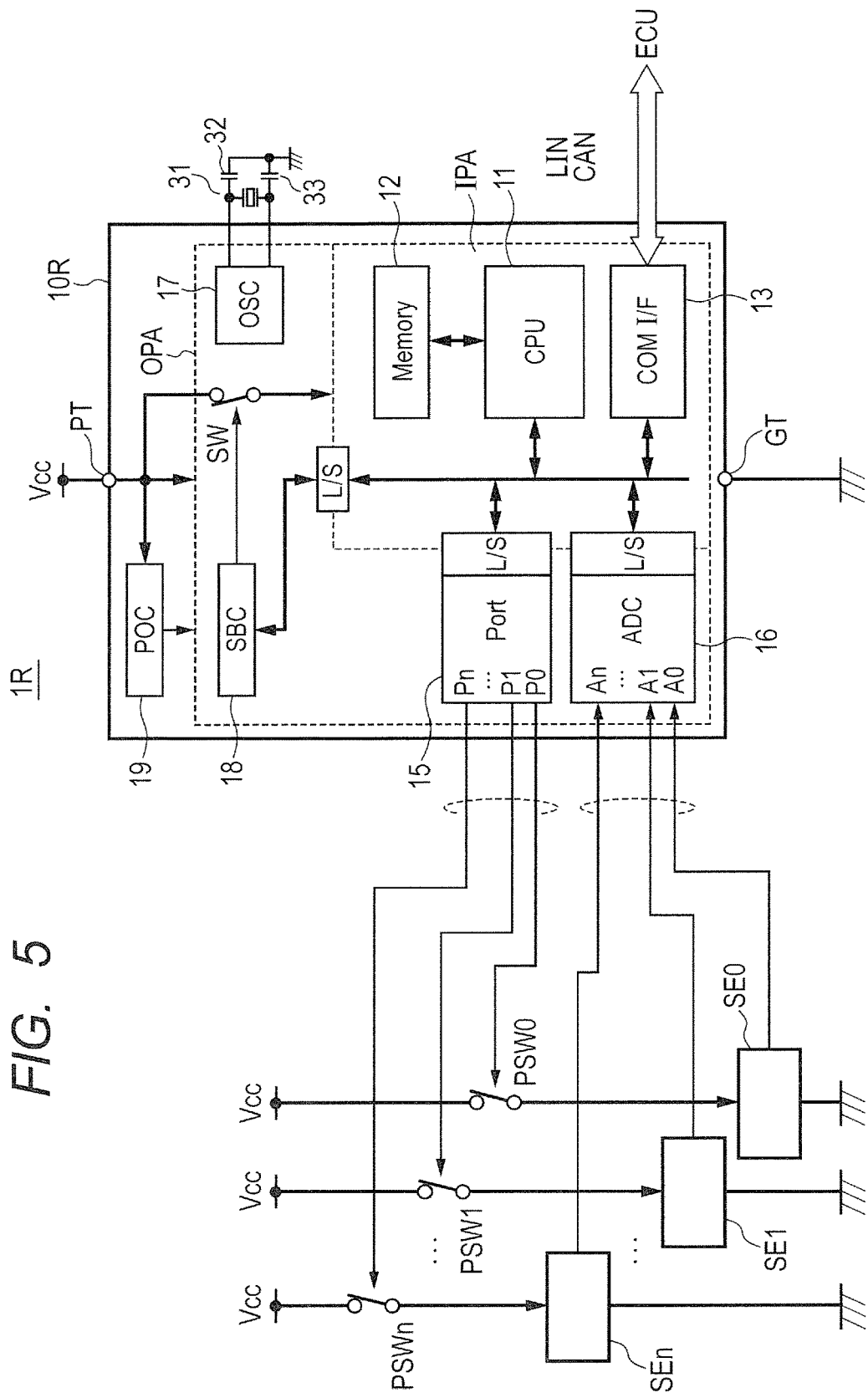
FIG. 5 is a block diagram for showing a configuration of an ECU system according to a comparison example.

FIG. 5 is a block diagram for showing a configuration of an ECU system according to a comparison example.

An ECU system 1R includes a microcontroller 10R, sensors SE0 to SEn, an oscillator 31, capacitors 32 and 33, power source switches PSW0 to PSWn, and a power source circuit (not shown). The power source circuit supplies a power source voltage (Vcc) to the microcontroller 10R and the sensors SE0 to SEn. Unlike the example, the microcontroller 10R includes no sequencer. A plurality of ports P0 to Pn of an input/output port unit 15R is coupled to the power source switches PSW0 to PSWn coupled to power source terminals of the sensors SE0 to SEn. It should be noted that the ports P0 to Pn of the comparison example include neither switching circuits MX nor sub-buffers SB unlike the configurations of the example and the modified example to be described later. Except for the above-described points, the ECU system 1R is similar to the ECU system 1. The power source switches PSW0 to PSWn of the ECU system 1R and wirings for supplying the power source to the power source switches PSW0 to PSWn are not necessary in the ECU system 1.

According to the example, the number of components can be reduced by incorporating the power manager for controlling the power source of the sensors into the microcontroller. Further, the intervention frequency of the CPU can be reduced and the power consumption can be also reduced by mounting the power manager in the microcontroller.

(Port)

Figure 6:
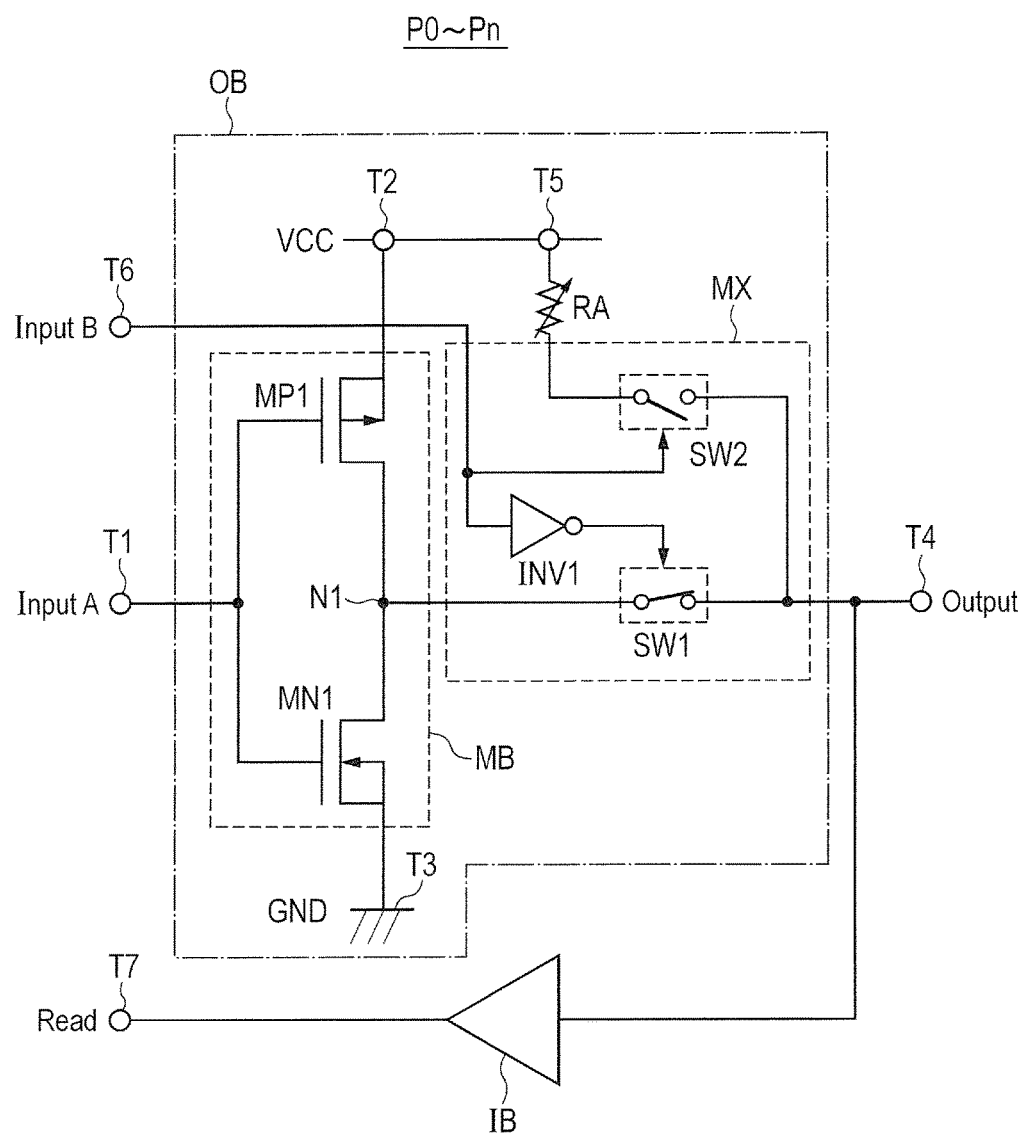
FIG. 6 is a circuit diagram for showing a configuration of a port of an input/output port unit of FIG. 2.
Figure 7:
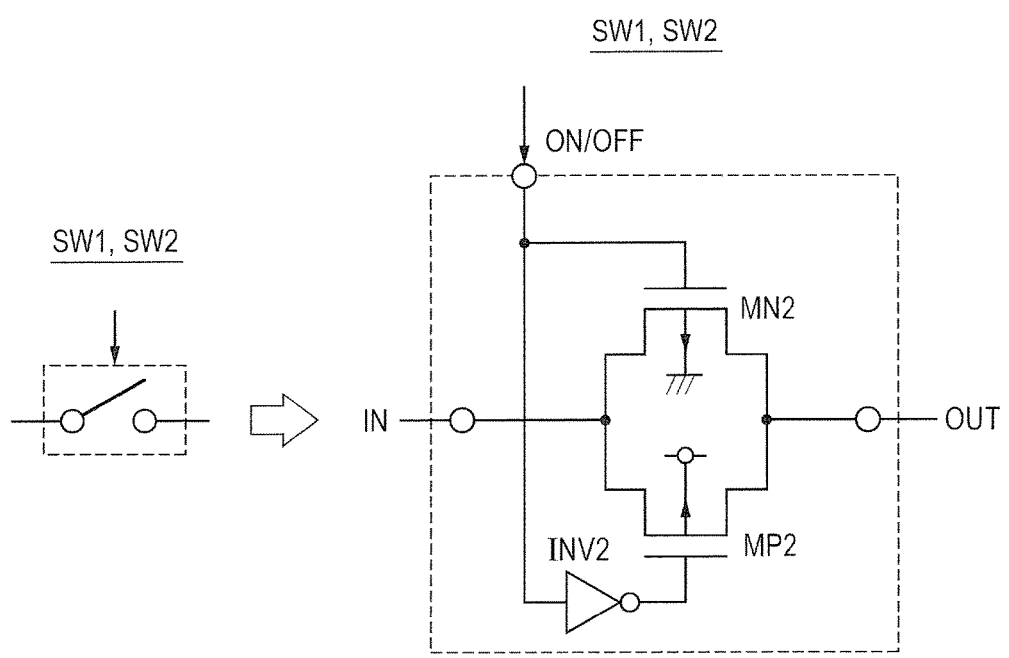
FIG. 7 is a circuit diagram for showing a configuration of a switch of FIG. 6.

FIG. 6 is a circuit diagram for showing a configuration of the port of the input/output port unit of FIG. 2. FIG. 7 is a circuit diagram for showing a configuration of the switch of FIG. 6.

Each of the ports P0 to Pn includes an output buffer OB and an input buffer IB. The output buffer OB includes a main buffer MB, a variable resistor RA, and a switching circuit MX that switches the output of the main buffer MB and the output of the variable resistor RA.

The main buffer MB is a CMOS inverter that is configured using a p-channel MOS transistor MP1 and an n-channel MOS transistor MN1. The source of the p-channel MOS transistor MP1 is coupled to a terminal T2 to which the power source voltage (Vcc) is applied, the drain thereof is coupled to a node N1, and the gate thereof is coupled to a terminal T1 into which an input signal (Input A) is input. The source of the n-channel MOS transistor MN1 is coupled to a terminal T3 coupled to the ground (GND), the drain thereof is coupled to the node N1, and the gate thereof is coupled to the terminal T1.

The switching circuit MX includes a switch SW1, a switch SW2, and an inverter INV1. The switch SW1 is arranged between the node N1 and a terminal T4, and applies or blocks electricity between the node N1 and the terminal T4 on the basis of an output of the inverter INV1. The switch SW2 is arranged between the terminal T4 and the variable resistor RA coupled to a terminal T5 to which the power source voltage (Vcc) is applied, and applies or blocks electricity between the node N1 and the terminal 14 on the basis of an output of a terminal T6 into which an input signal (Input B) is input.

The terminal T4 is coupled to an external terminal OT to be described later, and an output signal (Output) is output from the external terminal OT to the outside of the microcontroller 10. The input buffer IB reads a signal on the terminal 14 into a terminal T7 as a read signal (Read). It should be noted that the input buffer IB is configured using an inverter and the like.

Each of the switches SW1 and SW2 is an analog switch configured using a CMOS transfer gate that includes a p-channel MOS transistor MP2 and an n-channel MOS transistor MN2 coupled parallel with each other and an inverter INV2.

The input signal (Input A) of the terminal T1 is set by the power manager 14 and the CPU 11. The input signal (Input B) of the terminal T6 is set by the CPU 11.

FIG. 8 is a truth table of the output buffer of FIG. 6. Normal High that is an output signal when each of the input signal (Input B) and the input signal (Input A) is "1" is a port high output having a capability of driving the sensors SE0 to SEn. Weak High that is an output signal when the input signal (Input B) is "1" outputs a high level through the variable resistor RA. The switching circuit MX that is an analog switch exclusively switches Normal High and Weak High. Further, a resistor that is inserted when Weak High is output is the variable resistor, and thus the resistance value is set by a register. Further, the input buffer IB is used to confirm whether the voltage level of an output signal (Output) from the terminal 14 is low or high.

Each of the ports P0 to Pn supplying the power source voltage to the sensors SE0 to SEn supplies, at least, two values (Normal High and Weak High) to the sensors SE0 to SEn, and has a safety function of detecting disconnection, a voltage drop, and a ground fault using, at least, the two values. In the case where high reliability is not required, it is not necessary to provide the variable resistor RA and the switching circuit MX in each of the ports P0 to Pn.

FIG. 9 is a table for explaining failure detection by the port of FIG. 6.

When the application (ECU system) is normally operated, Weak High is not used, but only Normal High is used. Weak High is used right after the operation of the application starts or to periodically detect a failure.

In the case where the microcontroller 10 and the sensors SE0 to SEn are normally coupled to each other (normal condition), the power source can be supplied when Normal High is output. Thus, a user program (failure detection program) of the microcontroller 10 reads the read value of an output level of the terminal T4 as "1". On the other hand, when Weak High is output, an IR drop occurs when the operation current of the sensors SE0 to SEn to which the microcontroller 10 is coupled flows into the resistor RA, and the normal high level cannot be kept. Thus, the user program reads the read value of an output level of the terminal T4 as "0". However, the operation current of the sensors SE0 to SEn differs depending on products, and thus the user program can set the resistance value of the variable resistor RA so that "0" of the read value due to the IR drop can be detected.

In the case where disconnection occurs between the microcontroller 10 and the sensors SE0 to SEn and the terminal T4 is open (disconnection state), no current is consumed by the sensors SE0 to SEn. Thus, the level of the terminal T4 can be kept high even when Weak High is output. As a result, the disconnection can be detected when the user program reads "1".

Further, in the case where short-circuit occurs between the terminal T4 and the grounding potential (ground fault condition), the user program reads the output level of the terminal T4 as "0" when Normal High is output and when Weak High is output. Accordingly, the ground fault can be similarly detected.

Figure 10:
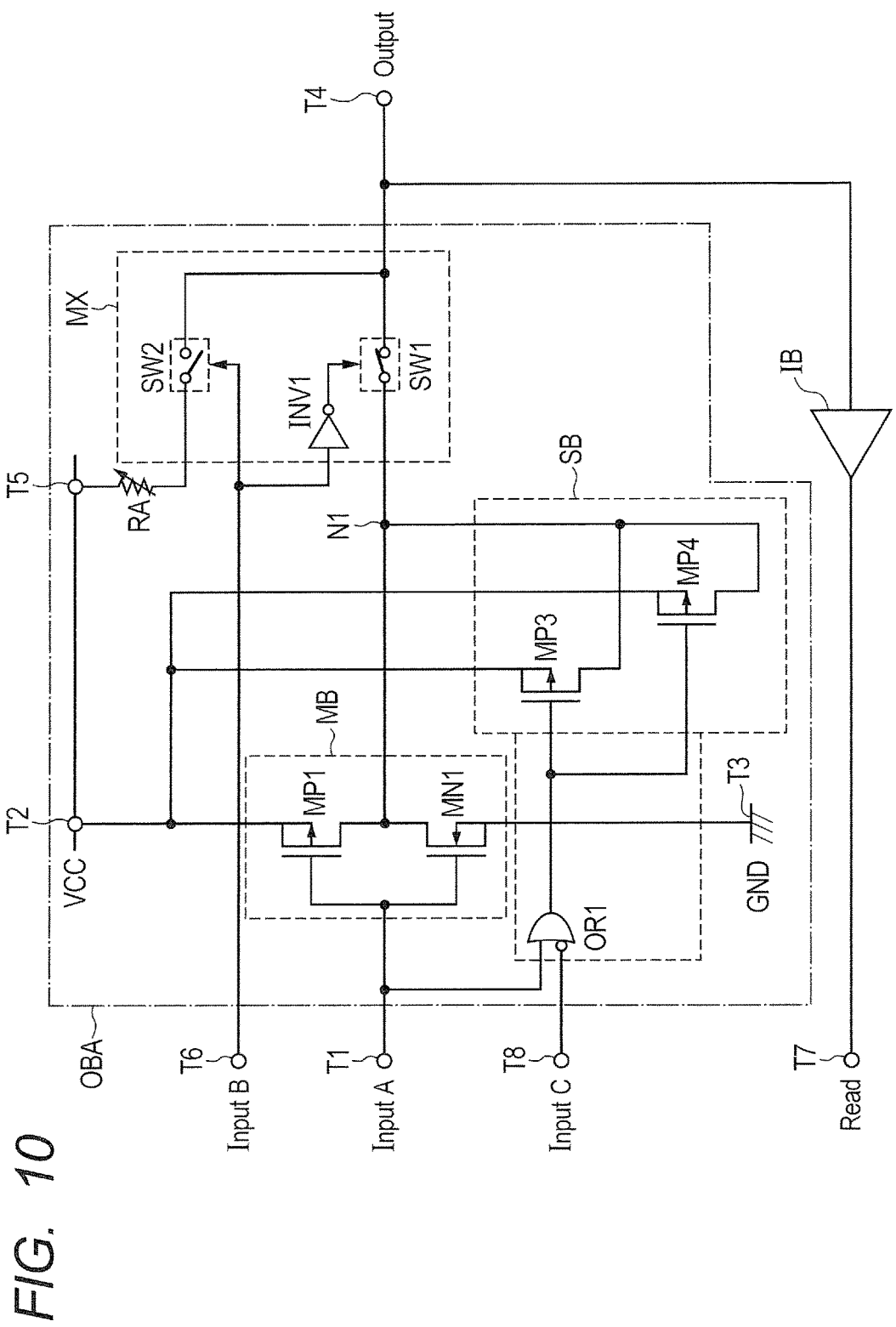
FIG. 10 is a circuit diagram for showing a configuration of a port according to a modified example.

FIG. 10 is a circuit diagram for showing a configuration of a port according to a modified example. FIG. 11 is a truth table of an output buffer of FIG. 10.

The port according to the modified example has a configuration in which a sub-buffer is added to the port of FIG. 6. A sub-buffer SB includes p-channel MOS transistors MP3 and MP4 coupled parallel with each other between a terminal T5 and a node N1, and an OR gate OR1. Each of the sources of the p-channel MOS transistors MP3 and MP4 is coupled to a terminal T2 to which the power source voltage (Vcc) is applied, each drain thereof is coupled to the node N1, and each gate thereof is coupled to the output of the OR gate OR1. Into the OR gate OR1, input are inverted signals of an input signal (Input A) input into a terminal T1 and an input signal (Input C) input into a terminal T8. The input signal (Input A) of the terminal T1 is set by a sequencer 14. An input signal (Input B) of a terminal T6 and the input signal (Input C) of the terminal T8 are set by the CPU 11.

The sub-buffer SB is used as an auxiliary buffer of the main buffer MB when the port is used for a power source. In the case where the port is used for a normal signal, Input C is 0. In the case where the port is used for a power source, Input C is 1. In other words, in the case where the input signal (Input C) is set to "0", the high level is output with a normal driving capability. In the case where the input signal (Input C) is set to "1", the high level is output with a strong driving capability. In the case where the driving capability is normal, the port is driven by one p-channel MOS transistor. In the case where the driving capability is strong, the port is driven by three p-channel MOS transistors. However, the present invention is not limited to this, but the sizes and the number of p-channel MOS transistors may be set by the register in accordance with the load.

(Power Manager)

Figure 12:
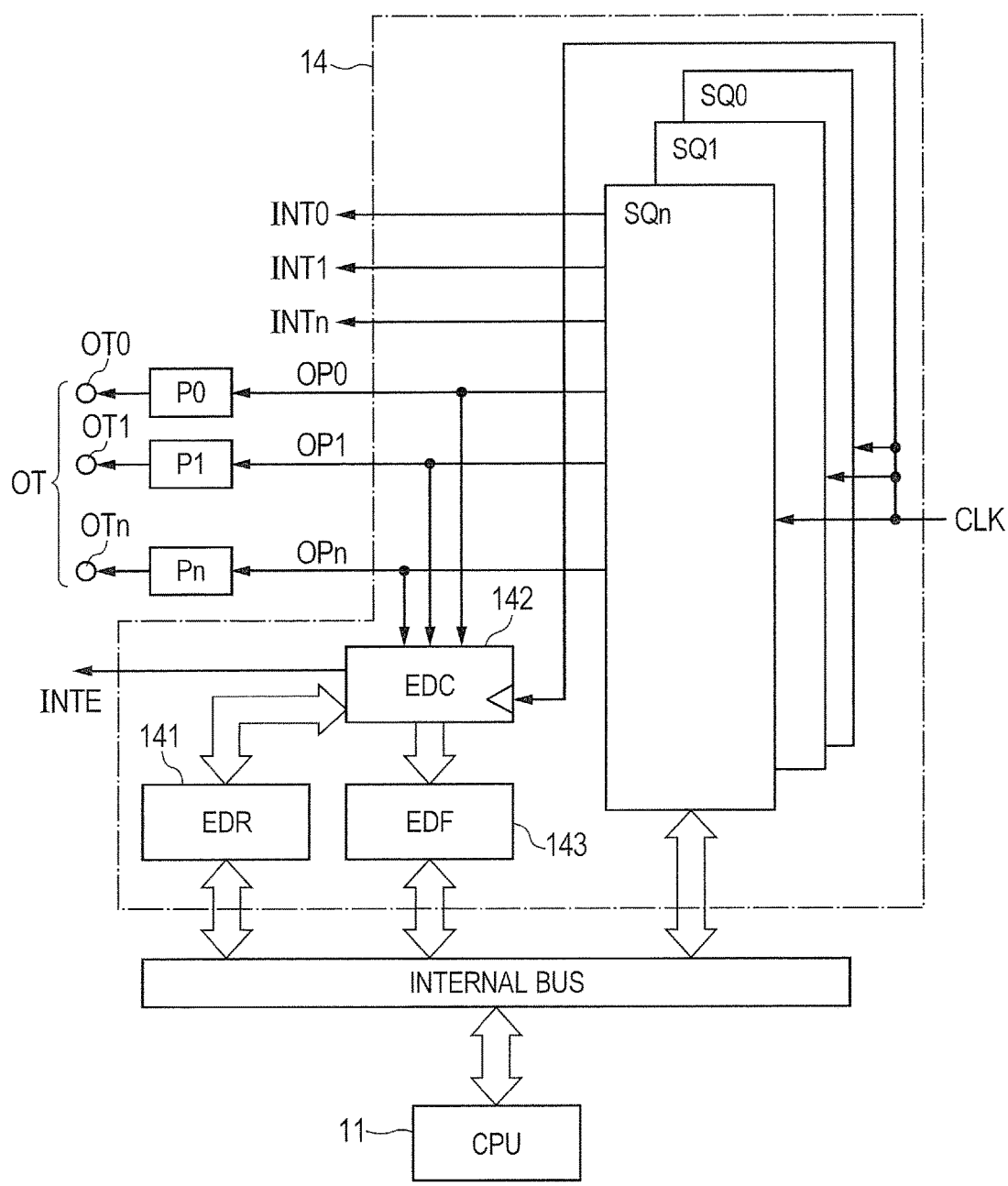
FIG. 12 is a block diagram for showing a configuration of a power manager of FIG. 2.
Figure 13:
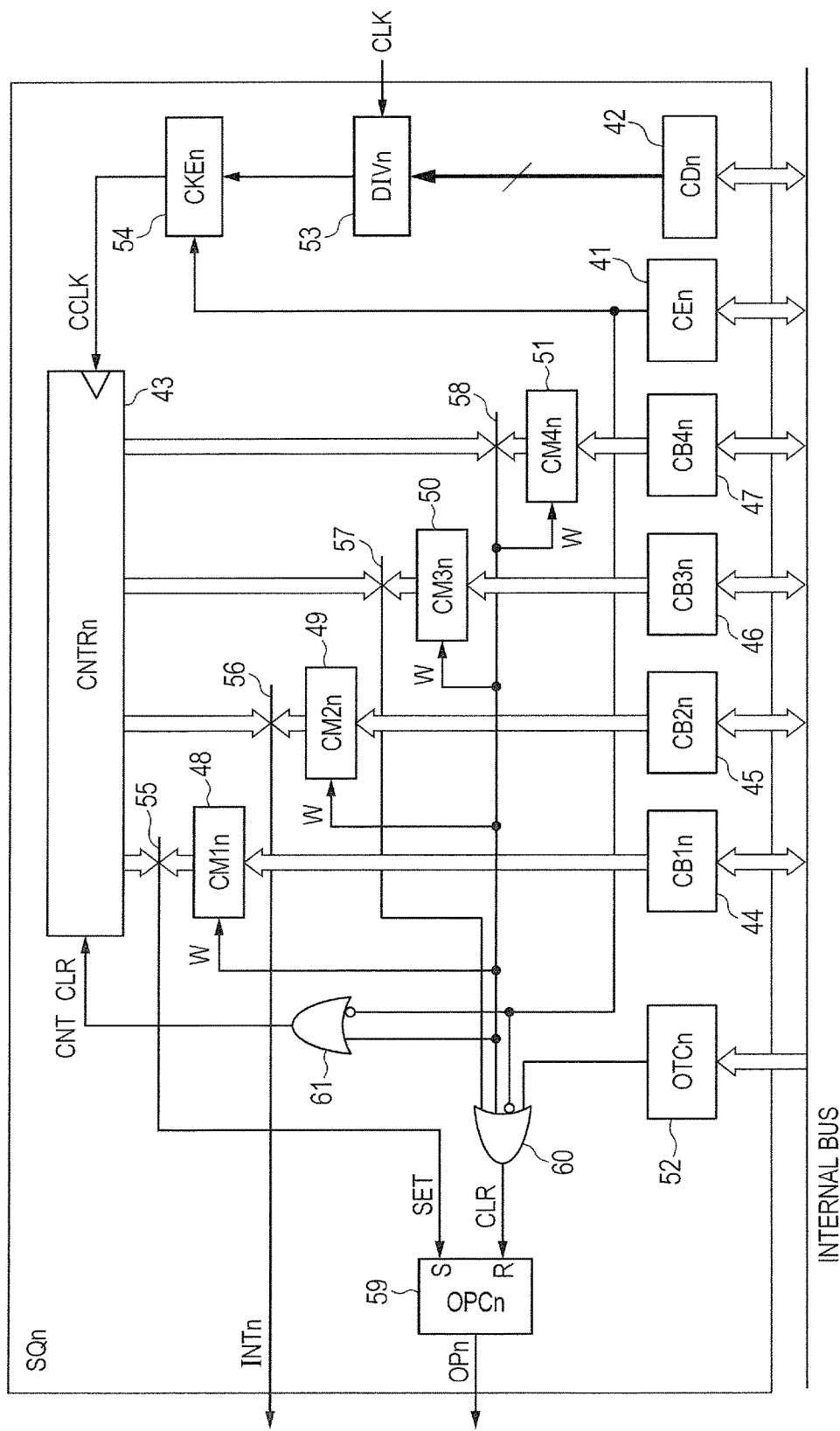
FIG. 13 is a block diagram for showing a configuration of a sequencer of FIG. 12.

FIG. 12 is a block diagram for showing a configuration of the power manager of FIG. 2. FIG. 13 is a block diagram for showing a configuration of a sequencer of FIG. 12.

The power manager 14 includes sequencers SQ0 to SQn associated with the ports P0 to Pn, an error definition register (EDR) 141, an error detection circuit (EDC) 142, and an error detection flag (EDF) 143. The sequencer SQn will be described below. It should be noted that the sequencers SQ0 to SQn-1 have the configurations same as the sequencer SQn. The "n" provided at the end of each abbreviation represents each constitutional element of the sequencer SQn.

The sequencer SQn includes a counter enable register n (CEn) 41, a clock divider register n (CDn) 42, a counter n (CNTRn) 43, a comparison buffer register 1n (CB1n) 44, a comparison buffer register 2n (CB2n) 45, a comparison buffer register 3n (CB3n) 46, and a comparison buffer register 4n (CB4n) 47. Further, the sequencer SQn includes a comparison register 1n (CM1n) 48, a comparison register 2n (CM2n) 49, a comparison register 3n (CM3n) 50, a comparison register 4n (CM4n) 51, an output terminal clear register n (OTCn) 52, a divider (DIVn) 53, a clock supply permission/prohibition setting circuit (CKEn) 54, comparators 55 to 58, an output control circuit (OPCn) 59, and OR gates 60 and 61. The circle "0" illustrated at each input of the OR gates 60 and 61 represents an inverted signal input.

Each of the registers will be described below.

The CEn (41) is a 1-bit register. When "0" is set, the operation of the sequencer SQn is prohibited. Then, the counter n (43) is cleared to 0, the output control circuit 59 is cleared, and the clock supply permission/prohibition setting circuit 54 is set to prohibition. When "1" is set to the CEn (41), the operation of the sequencer SQn is permitted, and the counter 43 performs counting.

The CDn (42) divides a source clock (CLK) using a value set by the register. The divided clocks are supplied as counter clocks (CCLK) of the counter n (43).

The counter n (43) is a timer counter that controls the output timing of the sequencer SQn.

Each of the CB1n (44), CB2n (45), CB3n (46), and CB4n (47) is provided to be able to change a comparison value during the operation of the counter, and a two-step configuration is formed together with the CM1n (48), CM2n (49), CM3n (50), and CM4n (51). The CPU 11 accesses the CB1n (44), CB2n (45), CB3n (46), and CB4n (47), and the comparison with the actual counter value is performed using the CM1n (48), CM2n (49), CM3n (50), and CM4n (51). The CM1n (48), CM2n (49), CM3n (50), and CM4n (51) are updated at the timing of clearing the counter n (43) (when the counter value of the counter n (43) and the setting value of the CM4n (51) match each other).

The CM1n (48) is a register that sets the timing of setting the output of an external terminal OTn to ON (High). When the counter value of the counter n (43) matches the setting value of the register, the output control circuit 59 is set, and the output of the external terminal OTn is set to ON (High).

The CM2n (49) is a register that sets the timing of activating an interruption signal (INTn). When the counter value of the counter n (43) matches the setting value of the register, the interruption signal (INTn) is activated. A user application (normal operation program) can perform a sensor process (reading of a value or the like) using the interruption as a trigger after securing a stable period of time from the time the power source of the sensor is turned on.

The CM3n (50) is a register that sets the timing of setting the output of the external terminal OTn to OFF (Low). When the counter value of the counter n (43) matches the setting value of the register, the output control circuit 59 is cleared, and the output of the external terminal OTn is set to OFF (Low).

The CM4n (51) is a register that sets the timing of clearing the counter n (43), the timing of clearing the output control circuit 59, the timing of setting the output of the external terminal OTn to OFF (Low), and the timing of updating the CM1n (48), CM2n (49), CM3n (50), and CM4n (51). When the counter value of the counter n (43) matches the setting value of the register, the counter n (43) is cleared. In addition, the output control circuit 59 is cleared, and the output of the external terminal OTn is set to OFF (Low). At the same time, the values of the CM1n (48), CM2n (49), CM3n (50), and CM4n (51) are updated to the values of the CB1n (44), CB2n (45), CB3n (46), and CB4n (47) (W).

The OTCn (52) is a 1-bit register, and is used when the CPU 11 directly sets the output of the external terminal OTn to OFF (Low) before the CB3n (50) matches or when the CB3n (50) is not used. When the CPU 11 writes "1" into the bit in a state where the output of the external terminal OTn is ON (High), the output control circuit 59 is cleared, and the output of the external terminal OTn is transited to the OFF (Low) state. When the bit is set in a state where the output of the external terminal OTn is OFF (Low), nothing happens.

Figure 14:
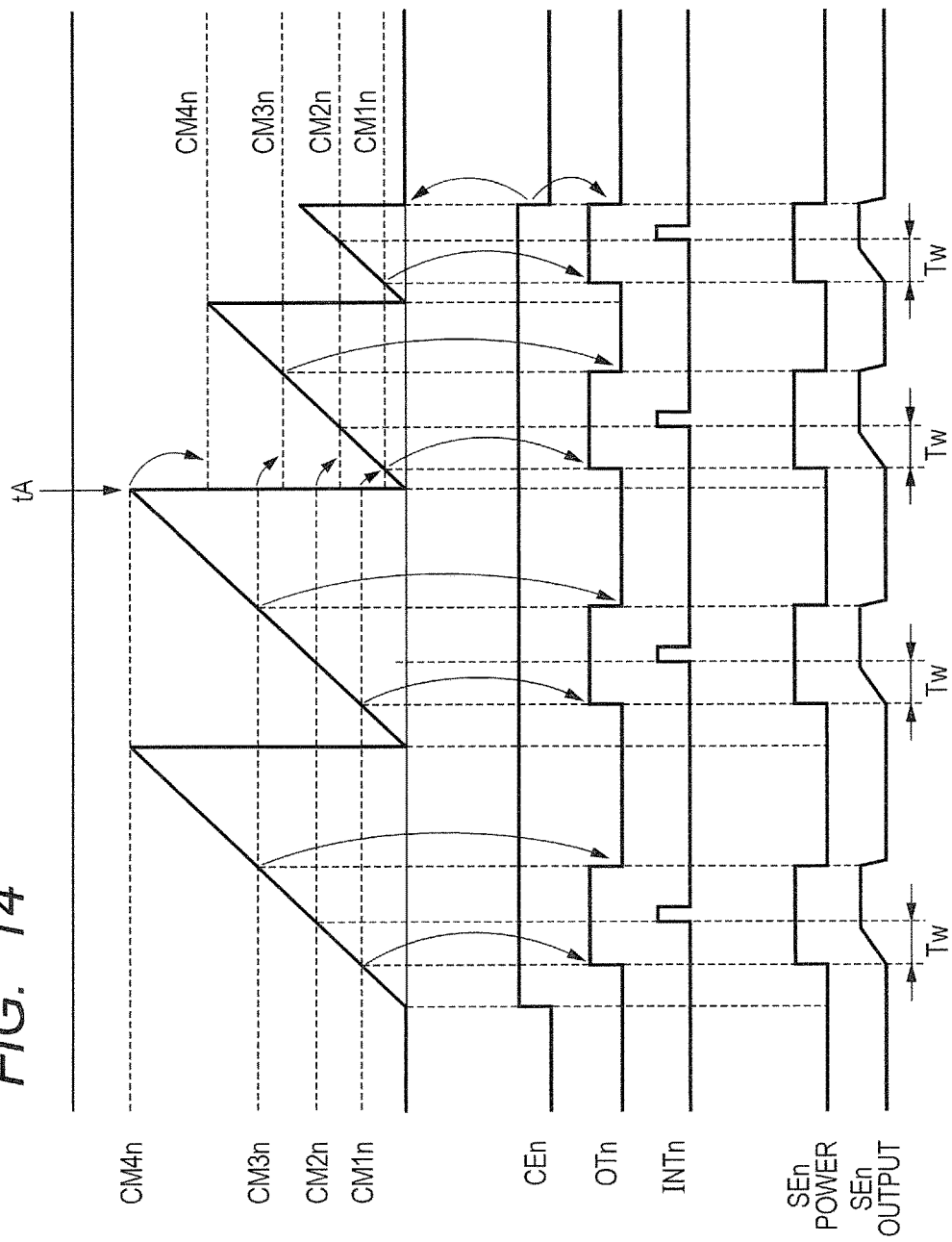
FIG. 14 is a timing chart for showing a first operation example of the sequencer of FIG. 13.

FIG. 14 is a timing chart for showing a first operation example of the sequencer of FIG. 13. The CM3n (49) is used in the first operation example.

When the CEn (41) is "0", counting is stopped in a state where the counter n (43) is cleared to "0", and the output of the external terminal OTn is OFF (Low). When the CEn (41) is set to "1", the operation of the sequencer SQn starts.

When the counter value of the counter 43 matches the setting value of the CM1n (48), the output of the external terminal OTn becomes ON (High), and supply of the power source to the sensor SEn starts.

A certain period of time (Tw) is required from the time the power source is supplied to the sensor SEn to the time the output of the sensor SEn is stabilized. Accordingly, a sensor stabilization time (Tw) is set to the CM2n (49). When the counter value of the counter n (43) matches the setting value of the CM2n (49), the interruption signal (INTn) is activated. In addition, the microcontroller 10 can efficiently read a stable signal by using the interruption signal (INTn) as a trigger.

Thereafter, when the counter value of the counter n (43) matches the setting value of the CM3n (50), the output of the external terminal OTn becomes OFF (Low).

When the cycle of the sequencer SQn is set by the CM4n (51) and the setting value of the register matches the counter value of the counter n (43), the counter n (43) is cleared. If the CPU 11 changed the values of the CB1n (44), CB2n (45), CB3n (46), and CB4n (47), the values of the CM1n (48), CM2n (49), CM3n (50), and CM4n (51) are updated to the changed values of the CB1n (44), CB2n (45), CB3n (46), and CB4n (47) at the timing (tA).

When the CEn (41) is "0", the counter n (43) is cleared to "0", and the clock supply permission/prohibition setting circuit 54 prohibits the supply of the counter clock (CCLK) to the counter 43. Thus, counting is stopped, and the output of the external terminal OTn becomes OFF (Low).

Figure 15:
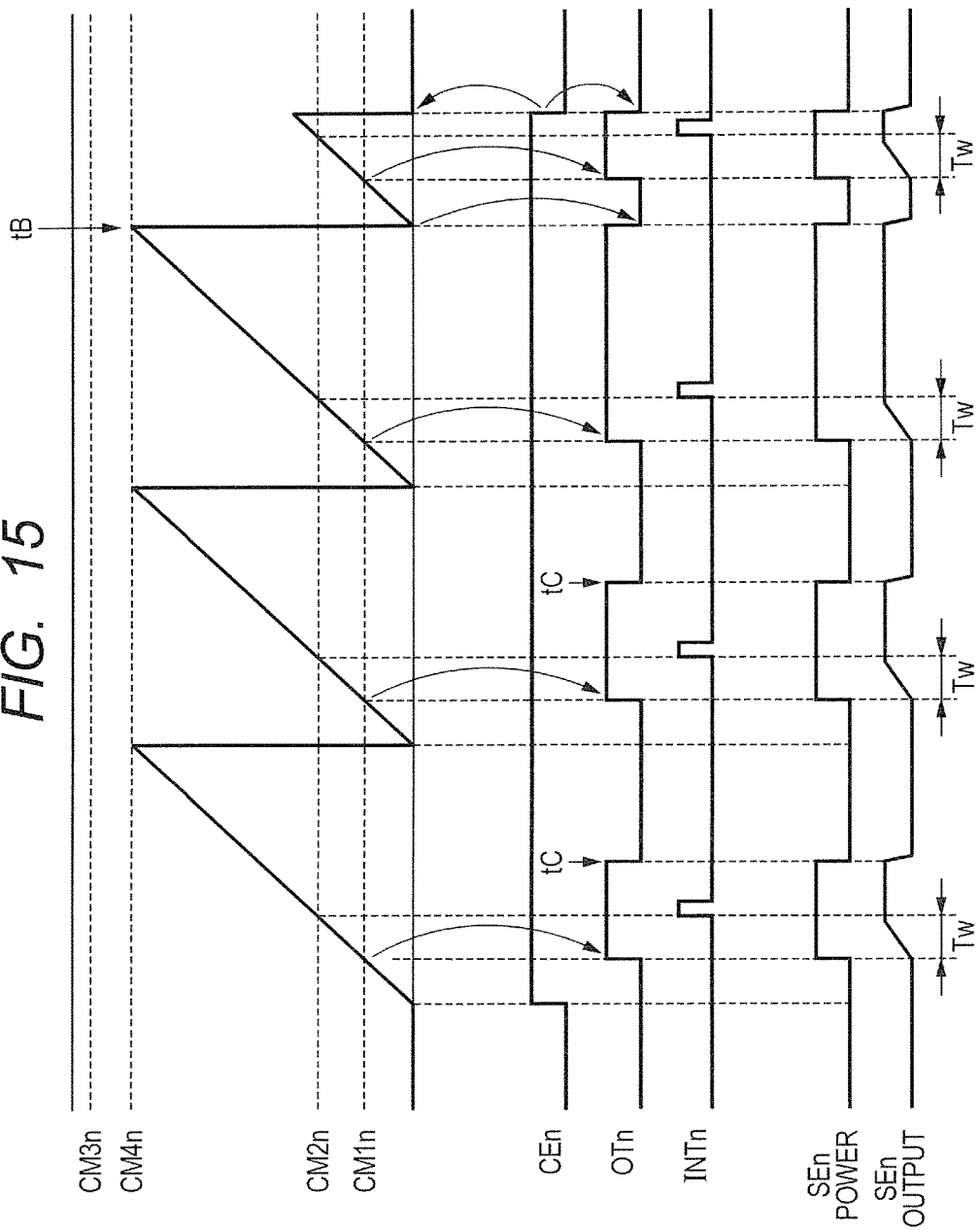
FIG. 15 is a timing chart for showing a second operation example of the sequencer of FIG. 13.

FIG. 15 is a timing chart for showing a second operation example of the sequencer of FIG. 13. In the second operation example, the OTCn (52) is used without using the CM3n (50) (setting a value larger than the setting of the CM4n (51)).

In the second operation example, the output of the external terminal OTn is not set to OFF (Low) at predetermined timing, but the CPU 11 sets the output of the external terminal OTn to OFF (Low) at arbitrary timing (after the CPU 11 reads the output value of the sensor). The method is conducted in such a manner that the CPU 11 writes "1" into the OTCn (52) at the timing (tC) of setting the output of the external terminal OTn to OFF (Low). If the external terminal OTn is kept ON (High) by the timing the setting value of the CM4n (51) matches the counter value of the counter n (43), the output of the external terminal OTn becomes OFF (Low).

Figure 16:
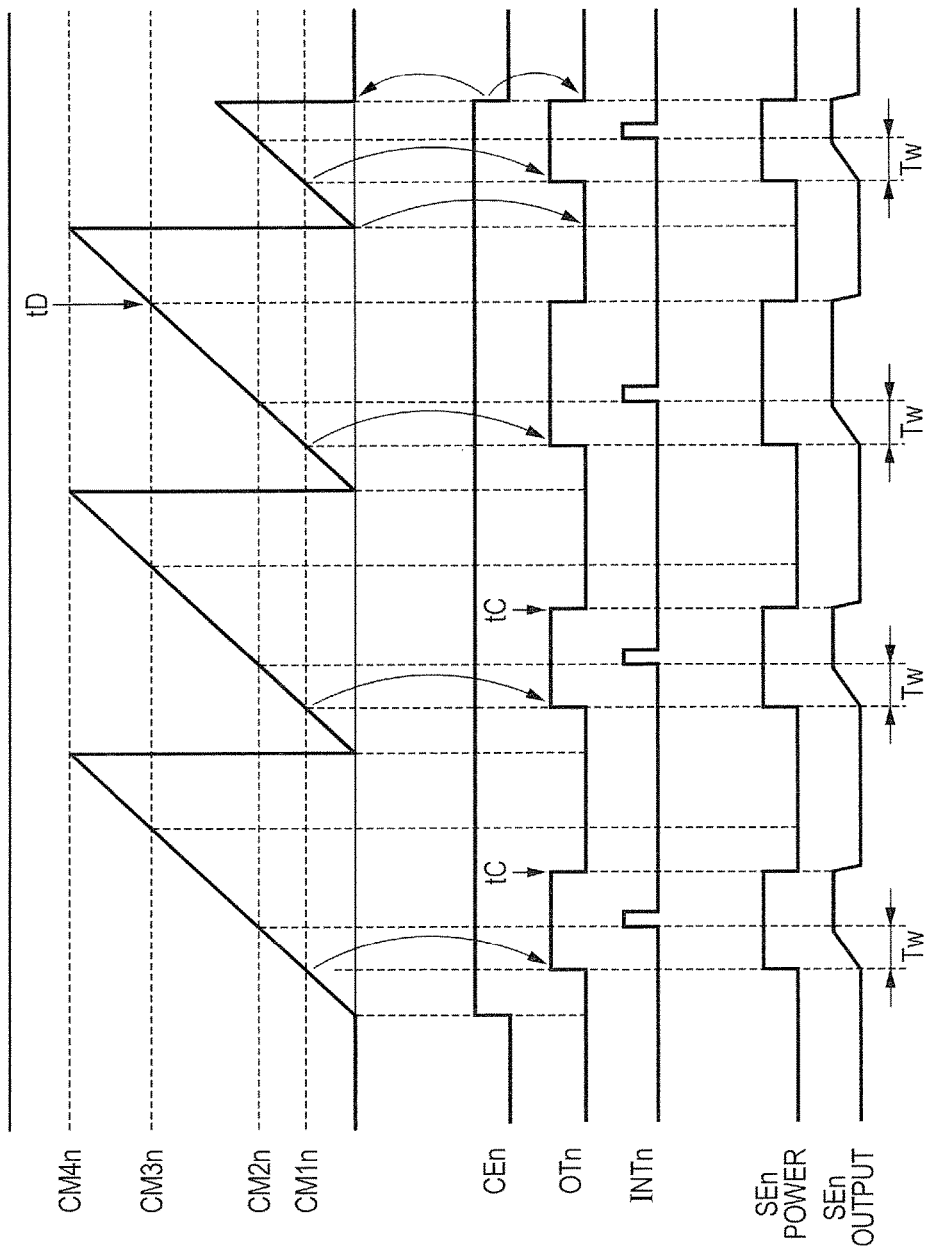
FIG. 16 is a timing chart for showing a third operation example of the sequencer of FIG. 13.

FIG. 16 is a timing chart for showing a third operation example of the sequencer of FIG. 13. In the third operation example, both of the CM3n (49) and the OTCn (52) are used together.

In the first operation example of FIG. 14 and the third operation example of FIG. 15, the CM3n (50) and the OTCn (52) are independently used as a method of setting the output of the external terminal OTn to OFF (Low). However, but the both may be used together. For example, the output of the external terminal OTn is set to OFF (Low) by writing "1" into the OTCn (52) at the timing (tC). The counter value of the counter n (43) matches the setting value of the CM3n (50) at the timing (tD), and the output of the external terminal OTn is set to OFF (Low).

FIG. 17 is a timing chart for explaining an error detection function of the power manager of FIG. 12.

The power manager 14 has a function such that when the outputs of a plurality of external terminals OT are simultaneously set to ON (High), the power manager 14 detects the fact to generate an interruption signal, and holds information of the terminals that are simultaneously set to ON.

The number of external terminals OT with the outputs simultaneously set to ON resulting in an error depends on a user application (depends on the power consumption of the sensor). Thus, the number is set in an error definition register 141 by a user. FIG. 17 shows an example in which an error occurs when the outputs of three or four external terminals OT simultaneously become ON.

The error detection circuit 142 samples output signals (OP0 to OPn) of the output control circuit 59 using a source clock (CLK), and obtains information of output terminals. When detecting ONs as the outputs of the external terminals OT the number of which is equal to or larger than that set by the error definition register 141, error interruption (INTE) is generated, and the information of output terminals that are simultaneously set to ON at the time is set in an error detection flag 143. The flag is held until being read from the CPU 11, and is cleared by being read. The CPU 11 sets the OTC (52) to clear the output control circuit 59, and sets the external terminal OT to OFF (Low).

In the case where "3" is set in the error definition register 141, the external terminals OT0, OT1, and OTn become simultaneously ON at the timing (tE). Thus, the error detection circuit 142 detects the error to activate the interruption signal (INTE), and error flags FLG0, FLG1, and FLGn of the error detection flag 143 associated with the terminals that are set to ON are set. The CPU 11 that accepts the interruption signal (INTE) reads the error detection flag 143 in an interruption process routine, and the error detection flag 143 is cleared.

In the case where "4" is set in the error definition register 141, the external terminals OT0, OT1, OT2, and OTn become simultaneously ON at the timing tB. Thus, the error detection circuit 142 detects the error to activate the interruption signal (INTE), and error flags FLG0, FLG1, FLG2, and FLGn of the error detection flag 143 associated with the external terminals that are set to ON are set.

In the example, the power source is supplied from the ports of the microcontroller to the sensors and the like instead of a power source circuit. The dedicated power manager that controls the ports for the power source supply timing is provided, so that the CPU processing load can be suppressed, and the power source of the sensors can be efficiently controlled.

However, since each port is used as a power source, the capability of the power source supply is inferior to that of a traditional power source circuit, and there is a case in which it is difficult to drive a plurality of sensors at the same time. On the other hand, there is no need to activate the respective sensors at the same time. Thus, the port output timing is adjusted on the microcontroller side so that the power source is not supplied to each sensor at the same time. Accordingly, the above-described problems can be solved.

However, an operating interval and time when the power source is supplied differ according to sensors. Thus, even if the timing is set with attention, there is an undeniable case in which the terminals are turned on at the same time with an extremely-low probability, or the terminals are turned on at the same time due to unexpected factors even though the terminals are not turned on at the same time in a normal system. When the terminals are turned on at the same time, the power source is not sufficiently supplied to each sensor, and thus an input value from each sensor is not reliable.

In this case, the terminals that are turned on at the same time are detected using the error signal (the error interruption signal (INTE) and the error detection flag). Accordingly, when the error signal is detected, the microcontroller destroys the value from each sensor, so that occurrence of an ECU abnormal operation caused by employing a wrong value from each sensor can be avoided.

The invention achieved by the inventors has been described above in detail on the basis of the embodiment, the example, and the modified example. However, it is obvious that the present invention is not limited to the embodiment, the example, and the modified example, but can be variously changed.

What is claimed is:

1. A semiconductor device, comprising:
an input terminal to be coupled to a signal terminal of an external device;
an A/D conversion circuit that converts an analog signal from the input terminal into a digital signal;
an external terminal to be coupled to a power source terminal of the external device;
a port that supplies a power source voltage for the external device to the external terminal;
a power manager that controls an output of the port; and
a CPU that controls an operation of the power manager,
wherein the port includes a main buffer and a sub-buffer which are coupled to the external terminal in parallel, and
wherein the sub-buffer is activated by a control signal to enhance a driving capability for the external terminal.

2. The semiconductor device according to claim 1, wherein the port includes a circuit to detect a disconnection between the external terminal and the power source terminal and a ground fault of the external terminal.

3. The semiconductor device according to claim 2, wherein the port includes:
a main buffer;
a variable resistor, one end of which is coupled to a power source;
a switching circuit that selectively couples an output of the main buffer and the other end of the variable resistor to the external terminal; and
an input buffer coupled to the external terminal.

4. The semiconductor device according to claim 1, wherein the power manager generates a signal that sets an output of the port to one of a high and a low on a basis of a content of a register set by the CPU.

5. The semiconductor device according to claim 4,
wherein a plurality of external terminals and a plurality of ports are provided, and
wherein the power manager detects an error when a predetermined number of external terminals become high at the same time.

6. The semiconductor device according to claim 1, wherein the external device comprises a sensor.

7. The semiconductor device according to claim 1, as comprising an in-vehicle electronic control unit (ECU), the semiconductor device further comprising a communication interface for connecting to an in-vehicle local area network (LAN).

8. The semiconductor device according to claim 1, wherein each of the main buffer and the sub-buffer includes a PMOS transistor between a power line and the external terminal.

9. A semiconductor device that couples to an outside sensor, the semiconductor device comprising, on one semiconductor substrate:
an external terminal to be coupled to a power source terminal of the sensor;
a port that supplies a power source voltage for the sensor to the external terminal;
a power manager that controls an ON/OFF of an output of the port on a basis of a content of a register;
a CPU that sets a predetermined value in the register;
an input terminal to be coupled to an output terminal of the sensor; and
an A/D conversion circuit that converts an analog signal input to the input terminal into a digital signal, wherein the power manager includes:
a counter that counts a number of clock signals;
a first comparison register;
a third comparison register;
a first comparator that compares a content of the counter with a content of the first comparison register; and
a third comparator that compares the content of the counter with a content of the third comparison register, and
wherein the power manager sets the output of the port to ON when the first comparator detects that the content of the counter matches the content of the first comparison register and the power manager sets the output of the port to OFF when the third comparator detects that the content of the counter matches the content of the third comparison register,
wherein the power manager further includes:
a fourth comparison register;
a fourth comparator that compares the content of the counter with a content of the fourth comparison register;
a first buffer register that updates the content of the first comparison register; and
a third buffer register that updates the content of the third comparison register, and
wherein the first comparison register is updated with the content of the first buffer register and the third comparison register is updated with a content of the third buffer register when the fourth comparator detects that the content of the counter matches the content of the fourth comparison register.

10. The semiconductor device according to claim 9, wherein the power manager further includes:
a second comparison register; and
a second comparator that compares the content of the counter with a content of the second comparison register, and
wherein the power manager outputs an interruption signal when the second comparator detects that the content of the counter matches the content of the second comparison register.

11. The semiconductor device according to claim 9, wherein the power manager further includes an output terminal clear register.

12. The semiconductor device according to claim 9,
wherein a plurality of external terminals and a plurality of ports are provided, and
wherein the power manager includes a plurality of sequencers that each respectively controls an ON/OFF of a corresponding one of the ports.

13. The semiconductor device according to claim 12, wherein the power manager includes:
an error circuit that detects an error when a number of external terminals set to ON at the same time is equal to or larger than a predetermined number;
an error definition register that stores the predetermined number; and
an error detection flag that displays the external terminals set to ON at the same time when the error detection circuit detects an error.

14. The semiconductor device according to claim 12, wherein each of the sequencers includes:

a counter that counts a number of clock signals;
a first comparison register;
a third comparison register;
a first comparator that compares a content of the counter with a content of the first comparison register; and
a third comparator that compares the content of the counter with a content of the third comparison register, and
wherein each of the sequencers sets the output of the port to ON when the first comparator detects that the content of the counter matches the content of the first comparison register, and each of the sequencers sets the output of the port to OFF when the third comparator detects that the content of the counter matches the content of the third comparison register.

15. The semiconductor device according to claim 14, wherein each of the sequencers includes:
a second comparison register;
a second comparator that compares the content of the counter with a content of the second comparison register; and
an output terminal clear register, and
wherein each of the sequencers outputs an interruption signal when the second comparator detects that the content of the counter matches the content of the second comparison register.

16. A semiconductor device that couples to an outside sensor, the semiconductor device comprising, on one semiconductor substrate:
an external terminal to be coupled to a power source terminal of the sensor;
a port that supplies a power source voltage for the sensor to the external terminal;
a power manager that controls an ON/OFF of an output of the port on a basis of a content of a register;
a CPU that sets a predetermined value in the register;
an input terminal to be coupled to an output terminal of the sensor; and
an A/D conversion circuit that converts an analog signal input to the input terminal into a digital signal,
wherein a plurality of external terminals and a plurality of ports are provided,
wherein the power manager includes a plurality of sequencers that each respectively controls an ON/OFF of a corresponding one of the ports,
wherein each of the sequencers includes:
a second comparison register;
a second comparator that compares the content of the counter with a content of the second comparison register; and
an output terminal clear register,
wherein each of the sequencers outputs an interruption signal when the second comparator detects that the content of the counter matches the content of the second comparison register,
wherein each of the sequencers includes:
a second comparison register;
a second comparator that compares the content of the counter with a content of the second comparison register; and
an output terminal clear register,
wherein each of the sequencers outputs an interruption signal when the second comparator detects that the content of the counter matches the content of the second comparison register,
wherein each of the sequencers includes:
a second comparison register;
a second comparator that compares the content of the counter with a content of the second comparison register; and
an output terminal clear register,
wherein each of the sequencers outputs an interruption signal when the second comparator detects that the content of the counter matches the content of the second comparison register, wherein each of the sequencers includes:
a fourth comparison register;
a fourth comparator that compares the content of the counter with a content of the fourth comparison register;
a first buffer register that updates the content of the first comparison register; and
a third buffer register that updates the content of the third comparison register, and
wherein the first comparison register is updated with the content of the first buffer register and the third comparison register is updated with the content of the third buffer register when the fourth comparator detects that the content of the counter matches the content of the fourth comparison register.

* * * * *